US012245374B2

United States Patent
Hong et al.

(10) Patent No.: US 12,245,374 B2
(45) Date of Patent: Mar. 4, 2025

(54) ELECTRONIC DEVICE COMPRISING INTERPOSER

(71) Applicant: SAMSUNG ELECTRONICS CO., LTD., Suwon-si (KR)

(72) Inventors: Eunseok Hong, Suwon-si (KR); Jungje Bang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 147 days.

(21) Appl. No.: 17/982,040

(22) Filed: Nov. 7, 2022

(65) Prior Publication Data

US 2023/0069694 A1    Mar. 2, 2023

Related U.S. Application Data

(63) Continuation of application No. PCT/KR2021/004345, filed on Apr. 7, 2021.

(30) Foreign Application Priority Data

May 7, 2020    (KR) .................. 10-2020-0054547

(51) Int. Cl.
*H05K 1/11*    (2006.01)

(52) U.S. Cl.
CPC ....... *H05K 1/116* (2013.01); *H05K 2201/042* (2013.01); *H05K 2201/093* (2013.01);
(Continued)

(58) Field of Classification Search
CPC ............. H05K 1/116; H05K 2201/042; H05K 2201/093; H05K 2201/09427; H05K 2201/09481; H05K 2201/10378
(Continued)

(56) References Cited

U.S. PATENT DOCUMENTS 6,738,249 B1    5/2004 Anthony et al.
8,842,443 B2 *  9/2014 Lim ...................... H05K 1/141
                                                    361/814
(Continued)

FOREIGN PATENT DOCUMENTS

JP    2005-251889 A    9/2005
JP       3819901 B2    9/2006
(Continued)

OTHER PUBLICATIONS

Communication dated Jul. 23, 2021, issued by the International Searching Authority in counterpart International Application No. PCT/KR2021/004345 (PCT/ISA/210).
(Continued)

*Primary Examiner* — Timothy J Thompson
*Assistant Examiner* — Michael F McAllister
(74) *Attorney, Agent, or Firm* — Sughrue Mion, PLLC (57) ABSTRACT

An electronic device includes a housing, a first substrate, a second substrate, and an interposer disposed between the first substrate and the second substrate and configured to electrically connect the first substrate and the second substrate. The interposer includes a substrate, a first surface, a second surface, and a side surface. The interposer further includes a plurality of first conductive pads, a plurality of second conductive pads, a plurality of conductive posts, a plurality of third conductive terminals at least partially exposed on the first surface and electrically connected to the plurality of first conductive pads via a first conductive via (CV), and a plurality of fourth conductive terminals at least partially exposed on the second surface and electrically connected to the plurality of second conductive pads via a second CV.

17 Claims, 7 Drawing Sheets

(52) U.S. Cl.
CPC .............. *H05K 2201/09427* (2013.01); *H05K 2201/09481* (2013.01); *H05K 2201/10378* (2013.01)

(58) Field of Classification Search
USPC ......................................................... 174/250
See application file for complete search history.

(56) References Cited

U.S. PATENT DOCUMENTS

| | | | |
|---|---|---|---|
| 10,342,131 B1* | 7/2019 | Kim | H05K 1/0243 |
| 10,595,407 B2* | 3/2020 | Kim | H05K 1/144 |
| 2001/0046129 A1* | 11/2001 | Broglia | H01R 12/52 |
| | | | 361/803 |
| 2002/0076919 A1* | 6/2002 | Peters | H01L 23/552 |
| | | | 257/E23.079 |
| 2005/0012217 A1 | 1/2005 | Mori et al. | |
| 2005/0052858 A1* | 3/2005 | Shima | H04B 15/00 |
| | | | 361/814 |
| 2005/0139988 A1 | 6/2005 | Ishida | |
| 2005/0168961 A1 | 8/2005 | Ono et al. | |
| 2009/0294161 A1 | 12/2009 | Yoshimura et al. | |
| 2012/0168221 A1 | 7/2012 | Okuyama et al. | |
| 2013/0201648 A1* | 8/2013 | Cheng | H05K 1/144 |
| | | | 361/803 |
| 2015/0055312 A1 | 2/2015 | Lee et al. | |
| 2015/0287672 A1* | 10/2015 | Yazdani | H01L 23/49827 |
| | | | 257/774 |
| 2017/0229775 A1* | 8/2017 | Navarro | H01Q 3/26 |
| 2018/0070484 A1* | 3/2018 | Mundell | H05K 1/0265 |
| 2019/0273030 A1 | 9/2019 | Lim et al. | |
| 2019/0319381 A1* | 10/2019 | Bang | H05K 7/1427 |
| 2020/0037437 A1* | 1/2020 | Hong | H05K 3/284 |
| 2020/0337188 A1 | 10/2020 | Yun et al. | |

FOREIGN PATENT DOCUMENTS

| | | |
|---|---|---|
| JP | 2012-142226 A | 7/2012 |
| KR | 10-0691725 B1 | 3/2007 |
| KR | 10-1164301 B1 | 7/2012 |
| KR | 10-2015-0022204 A | 3/2015 |
| KR | 10-1538539 B1 | 7/2015 |
| KR | 10-2019-0139597 A | 12/2018 |
| KR | 10-2019-0105329 A | 9/2019 |
| KR | 10-2019-0139653 A | 12/2019 |
| KR | 10-2020-0032911 A | 3/2020 |

OTHER PUBLICATIONS

Communication dated Jul. 23, 2021, issued by the International Searching Authority in counterpart International Application No. PCT/KR2021/004345 (PCT/ISA/237).

Communication issued on Sep. 24, 2024 from the Korean Intellectual Property Office for Korean Patent Application No. 10-2020-0054547.

* cited by examiner

ELECTRONIC DEVICE COMPRISING INTERPOSER

CROSS-REFERENCE TO RELATED APPLICATIONS

This application is a by-pass continuation application of International Application No. PCT/KR2021/004345, filed on Apr. 7, 2021, which based on and claims priority to Korean Patent Application No. 10-2020-0054547, filed on May 7, 2020, in the Korean Intellectual Property Office, the disclosures of which is incorporated by reference herein in their entireties.

BACKGROUND

1. Field

The disclosure relate to an electronic device including an interposer.

2. Description of Related Art

In order to secure competitiveness with other manufacturers, electronic devices are gradually becoming slimmer, and are being developed to increase rigidity, strengthen design aspects, and differentiate functional elements thereof.

A plurality of printed circuit boards disposed in the inner space of an electronic device may be disposed in a manner of being stacked for slimming of the electronic device, and are being developed to reduce a mounting space by using a mutually efficient electrical connection structure therebetween.

An electronic device may include at least two boards (e.g., printed circuit boards (PCBs)) disposed in the inner space thereof. Respective boards may be disposed in a manner of being stacked to efficiently secure a mounting space, and may be electrically connected via an interposer (e.g., a stacked board) disposed therebetween. For example, each of the boards may include a plurality of conductive terminals, and two boards may be electrically connected to each other by being brought into physical contact with a plurality of corresponding conductive terminals disposed on corresponding surfaces of the stacked substrate.

However, since conductive terminals disposed on a surface of the interposer that faces each board are arranged to be electrically connected through vias provided through physical machining (e.g., drilling) due to the characteristics of a dielectric substrate, there is a limit to the size reduction. Therefore, it may be difficult to arrange a large number of conductive terminals in an interposer having the same area. For example, when a large number of conductive terminals are disposed, it is necessary to increase the area of the interposer, which may go against the slimming of an electronic device. In addition, when conductive terminals having a relatively large size are soldered, a connection defect such as a short circuit inadvertently connected to a peripheral conductive terminal may occur. In addition, since a conductive portion (e.g., a side plated metal for shielding) disposed on a side surface of the interposer should be connected to the outermost conductive terminals among the conductive terminals and a ground, terminals for signal transmission may be insufficient.

According to various embodiments of the disclosure, it is possible to provide an electronic device including an interposer.

According to various embodiments, it is possible to provide an electronic device including an interposer on which it is possible to dispose a relatively large number of conductive terminals in substantially the same area by reducing the size of the conductive terminals.

According to various embodiments, it is possible to provide an electronic device including an interposer on which it is possible to dispose a relatively large number of conductive terminals in substantially the same area by providing an improved ground connection structure.

The technical problems to be addressed by the disclosure are not limited to those described above, and other technical problems, which are not described above, may be clearly understood by a person ordinarily skilled in the related art to which this disclosure belongs.

SUMMARY

According to an aspect of the disclosure, an electronic device includes a housing, a first substrate disposed in an inner space of the housing and including a plurality of first conductive terminals, a second substrate disposed in the inner space to be substantially parallel to the first substrate and including a plurality of second conductive terminals, and an interposer disposed between the first substrate and the second substrate and configured to electrically connect the first substrate and the second substrate. The interposer includes a substrate including a plurality of insulating layers, a first surface facing the first substrate, a second surface facing the second substrate, and a side surface surrounding a space between the first surface and the second surface. The interposer further includes a plurality of first conductive pads disposed on a first insulating layer among the plurality of insulating layers, a plurality of second conductive pads disposed on a second insulating layer among the plurality of insulating layers, a plurality of conductive posts configured to electrically connect the plurality of first conductive pads to the plurality of second conductive pads, a plurality of third conductive terminals at least partially exposed on the first surface and electrically connected to the plurality of first conductive pads via a first conductive via (CV), and a plurality of fourth conductive terminals at least partially exposed on the second surface and electrically connected to the plurality of second conductive pads via a second CV.

According to an aspect of the disclosure, a housing, a first substrate disposed in an inner space of the housing and including a plurality of first conductive terminals, a second substrate disposed in the inner space to be substantially parallel to the first substrate and including a plurality of second conductive terminals, and an interposer disposed between the first substrate and the second substrate to electrically connect the first substrate and the second substrate. The interposer includes a substrate including a plurality of insulating layers, a first surface facing the first substrate, a second surface facing the second substrate, and a side surface surrounding a space between the first surface and the second surface. The interposer also includes a plurality of conductive pads disposed on a first insulating layer among the plurality of insulating layers, a plurality of third conductive terminals at least partially exposed on the first surface, electrically connected to the plurality of conductive pads via a CV, and electrically connected to the plurality of first conductive terminals, a plurality of fourth conductive terminals at least partially exposed on the second surface and electrically connected to the plurality of second conductive terminals, and a plurality of conductive posts configured to electrically connect the plurality of conductive pads to the plurality of third conductive terminals.

According to various embodiments, an electronic device may include: a housing; a first substrate disposed in an inner space of the housing and including a plurality of first conductive terminals; a second substrate disposed in the inner space to be substantially parallel to the first substrate and including a plurality of second conductive terminals; and an interposer disposed between the first substrate and the second substrate and configured to electrically interconnect the first substrate and the second substrate, wherein the interposer may include: a dielectric substrate including a plurality of insulating layers, and including a first surface facing the first substrate, a second surface facing the second substrate, and a side surface surrounding a space between the first surface and the second surface; a plurality of first conductive pads disposed on a first insulating layer close to the first surface among the plurality of insulating layers; a plurality of second conductive pads disposed on a second insulating layer close to the second surface among the plurality of insulating layers; a plurality of conductive posts configured to electrically connect the plurality of first conductive pads to the plurality of second conductive pads; a plurality of third conductive terminals at least partially exposed on the first surface and electrically connected to the plurality of first conductive terminals via a conductive via (CV); and a plurality of fourth conductive terminals at least partially exposed on the second surface and electrically connected to the plurality of second conductive terminals via a CV.

According to various embodiments, an electronic device may include: a housing; a first substrate disposed in an inner space of the housing and including a plurality of first conductive terminals; a second substrate disposed in the inner space to be substantially parallel to the first substrate and including a plurality of second conductive terminals; and an interposer disposed between the first substrate and the second substrate to electrically interconnect the first substrate and the second substrate, wherein the interposer may include: a dielectric substrate including a plurality of insulating layers, and including a first surface facing the first substrate, a second surface facing the second substrate, and a side surface surrounding a space between the first surface and the second surface; a plurality of conductive pads disposed on a first insulating layer close to the first surface among the plurality of insulating layers; a plurality of third conductive terminals at least partially exposed on the first surface, electrically connected to the plurality of conductive pads via CVs, and electrically connected to the plurality of first conductive terminals; a plurality of fourth conductive terminals at least partially exposed on the second surface and electrically connected to the plurality of second conductive terminals; and a plurality of conductive posts configured to electrically connect the plurality of conductive pads to the plurality of third conductive terminals.

According to various embodiments, an interposer may include: a dielectric substrate including a plurality of insulating layers, and including a first surface facing a first substrate, a second surface facing a second substrate, and a side surface surrounding a space between the first surface and the second surface; a plurality of first conductive pads disposed on a first insulating layer close to the first surface among the plurality of insulating layers; a plurality of second conductive pads disposed on a second insulating layer close to the second surface among the plurality of insulating layers; a plurality of conductive posts configured to electrically connect the plurality of first conductive pads to the plurality of second conductive pads; a plurality of first conductive terminals at least partially exposed on the first surface and electrically connected to the plurality of first conductive pads via CVs; and a plurality of second conductive terminals at least partially exposed on the second surface and electrically connected to the plurality of second conductive pads via CVs.

According to exemplary embodiments of the disclosure, it is possible to dispose a relatively large number of conductive terminals in the same area by electrically connecting a conductive pad (e.g., a land) provided through a CV to a conductive terminal formed to have a smaller area than the conductive pad on an outer surface of a board. In addition, it is possible to solve the problem of poor connection (e.g., short circuit) between adjacent conductive terminals by reducing the size (connection area) of the conductive terminals. Furthermore, by providing an improved ground connection structure, it is possible to help slim an electronic device through miniaturization of the interposer.

In addition, various effects directly or indirectly identified through the disclosure may be provided.

BRIEF DESCRIPTION OF THE DRAWINGS

In connection with the description of the drawings, the same or similar components may be denoted by the same or similar reference numerals. The above and other aspects, features, and advantages of certain embodiments of the present disclosure will be more apparent from the following description taken in conjunction with the accompanying drawings, in which.

DETAILED DESCRIPTION

Figure 1:
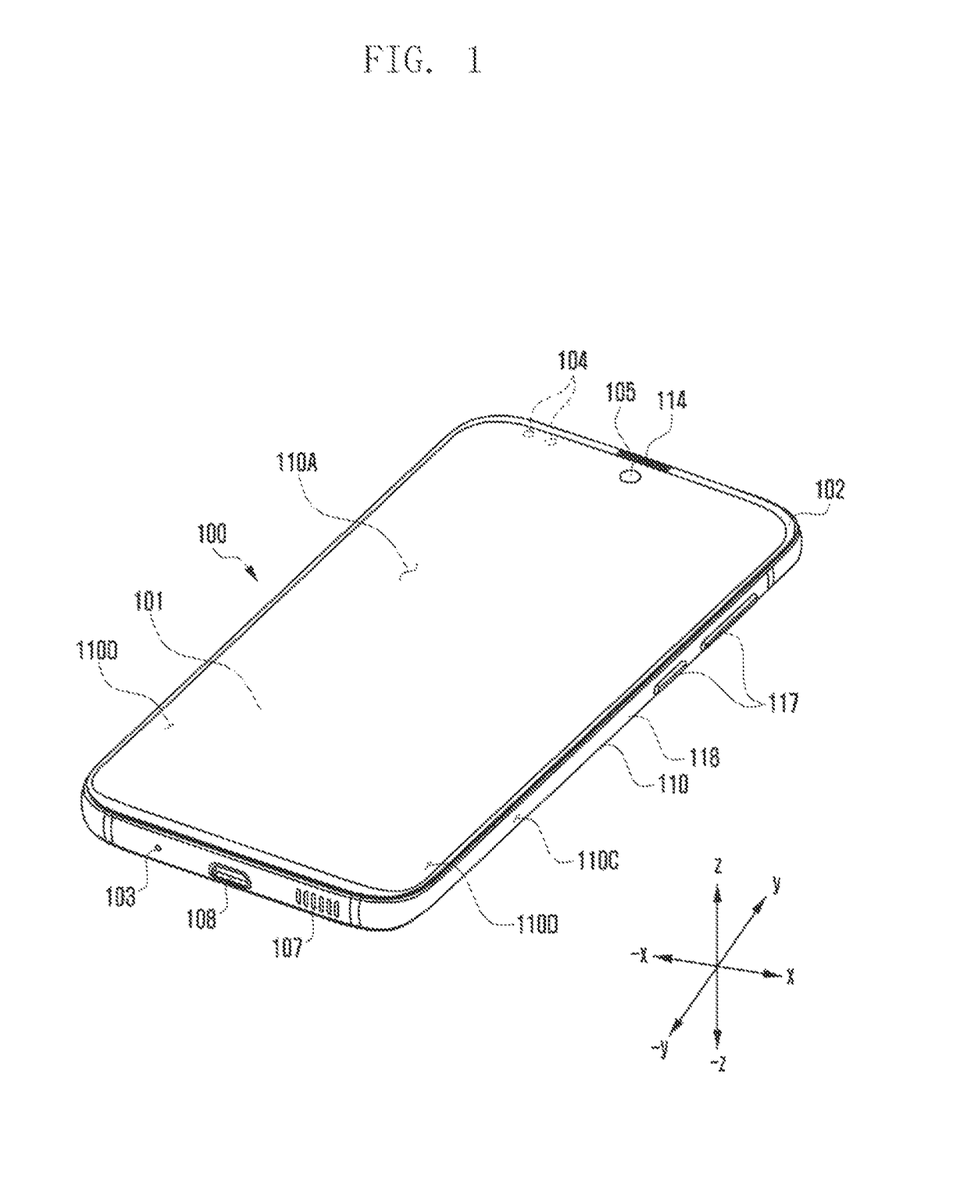
FIG. 1 is a front perspective view of an electronic device (e.g., a mobile electronic device) according to various embodiments of the disclosure.
Figure 2:
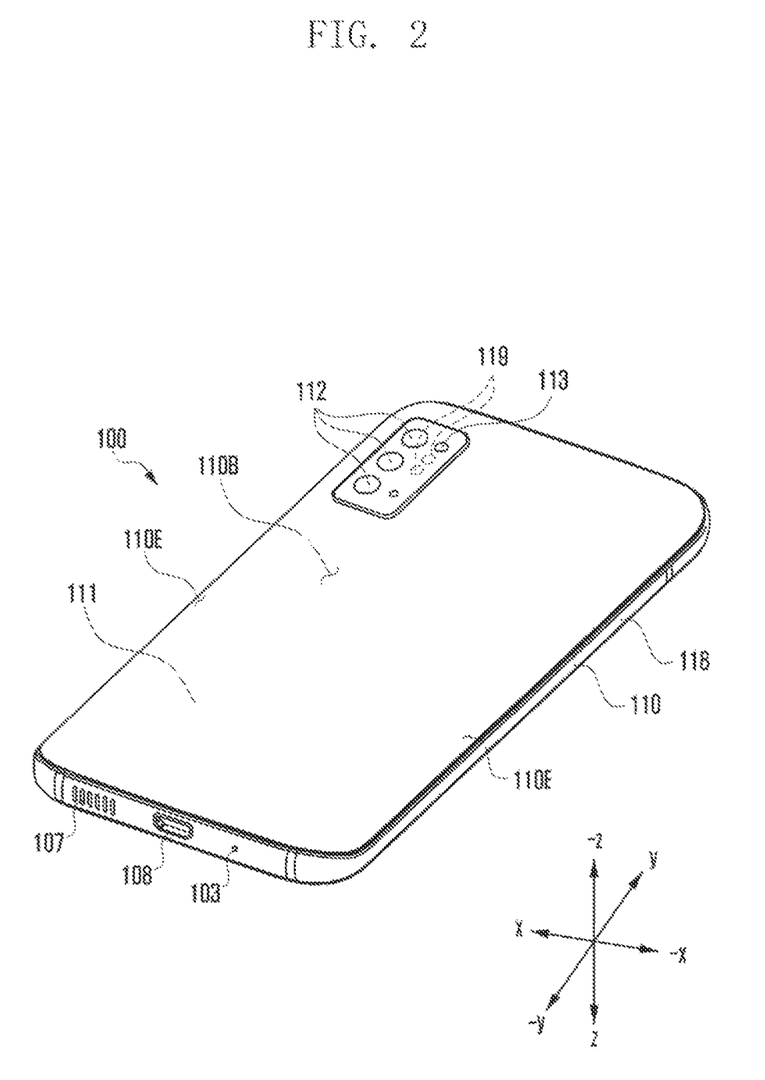
FIG. 2 is a rear perspective view of the electronic device of FIG. 1 according to various embodiments of the disclosure.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
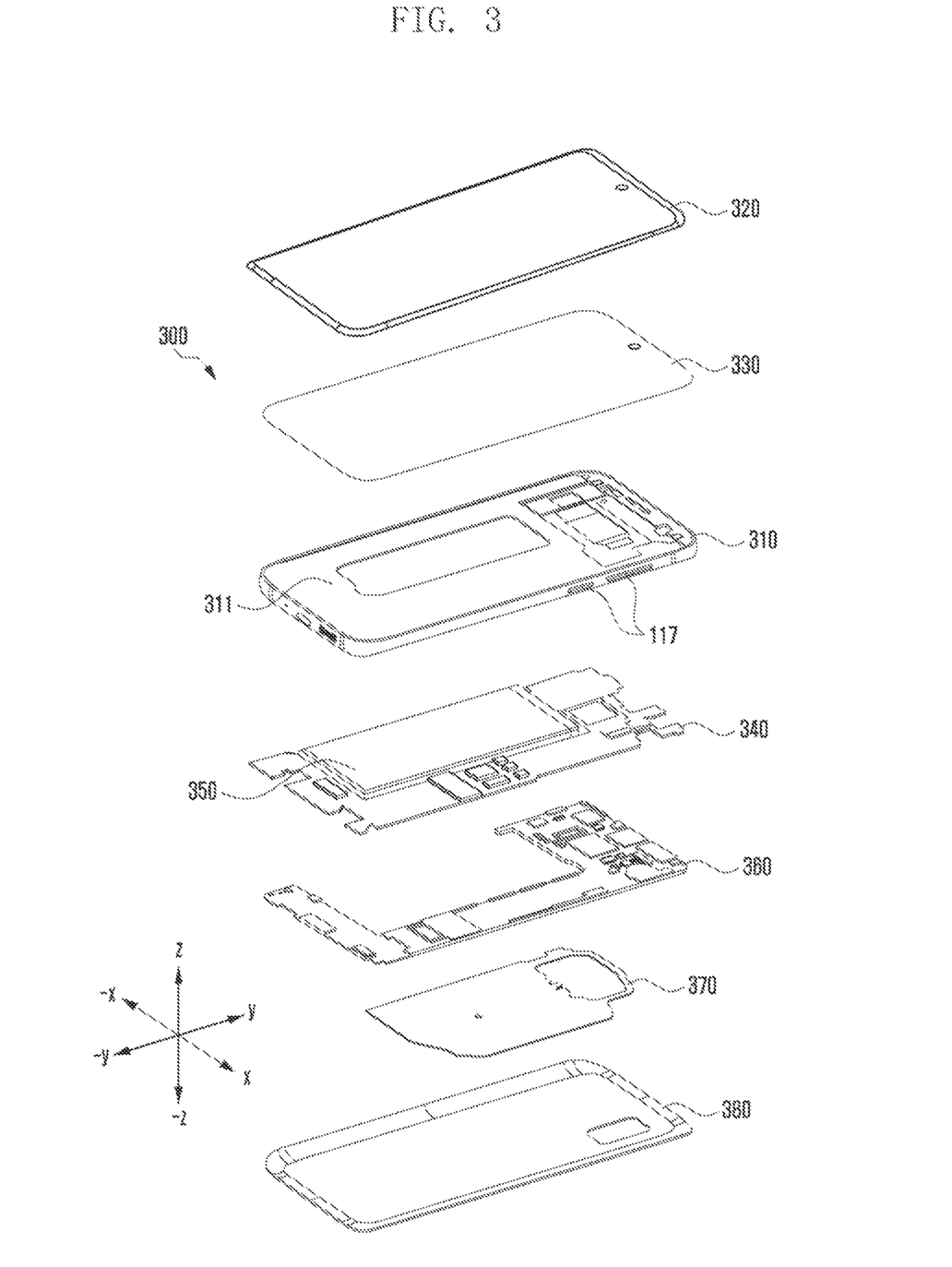
FIG. 3 is an exploded perspective view of the electronic device of FIG. 1 according to various embodiments of the disclosure.

FIG. 3 illustrates an exploded perspective view showing a mobile electronic device shown in FIG. 1 according to an embodiment of the disclosure.

The electronic device 300 in FIG. 3 may be at least partially similar to the electronic device 100 in FIG. 1 and FIG. 2 or may further include other embodiments.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
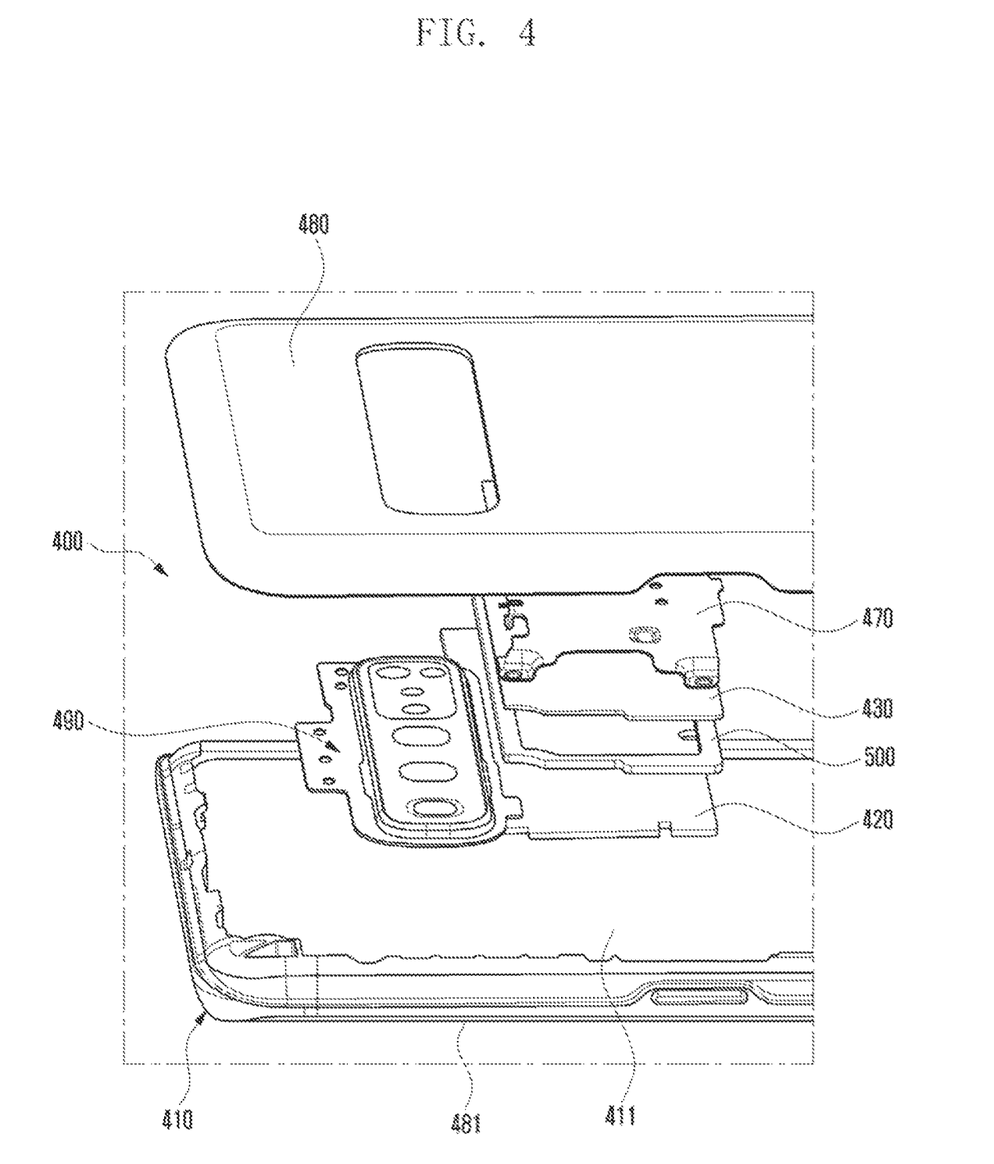
FIG. 4 is an exploded perspective view of an electronic device to which an interposer is applied between two boards according to various embodiments of the disclosure.

FIG. 4 is an exploded perspective view of an electronic device 400 including interposers 500 applied between two boards 420 and 430 according to various embodiments of the disclosure.

The electronic device 400 of FIG. 4 may be at least partially similar to the electronic device 100 in FIGS. 1 and 2 or the electronic device 300 of FIG. 3, or may include other embodiments of the same.

Referring to FIG. 4, the electronic device 400 (e.g., the electronic device 300 in FIG. 3) may include a housing (e.g., the housing 110 in FIG. 1) including a front cover 481 (e.g., the front plate 320 in FIG. 3), a rear cover 480 (e.g., the rear plate 380 in FIG. 3) facing away from the front cover 481, and a side frame 410 (e.g., the side member 310 in FIG. 3) surrounding the space between the front cover 481 and the rear cover 480. According to an embodiment, the electronic device 400 may include a first support member 411 (e.g., the first support member 311 in FIG. 3) disposed in the inner space thereof. According to an embodiment, the first support member 411 may be disposed to extend into the inner space of the electronic device 400 from the side frame 410. As another example, the first support member 411 may be separately provided in the inner space of the electronic device 400. According to an embodiment, the first support member 411 may extend from the side member 410, and at least a partial area thereof may be formed of a conductive material. According to an embodiment, the electronic device 400 may further include at least one electronic component 490 (e.g., a camera module) disposed in a space between the front cover 481 and the rear cover 480.

According to various embodiments, the electronic device 400 may include a pair of boards 420 and 430 (e.g., a printed circuit board (PCB)) disposed between the first support member 411 and the rear cover 480 in the inner space thereof. According to an embodiment, the pair of boards 420 and 430 may be disposed such that at least some areas overlap when the front cover 481 is viewed from above (e.g., in the Z-axis direction in FIG. 3). According to an embodiment, the pair of boards 420 and 430 may include a first substrate 420 (e.g., a main board) disposed between the first support member 411 and the rear cover 480, and a second substrate 430 (e.g., a sub-board) disposed between the first substrate 420 and the rear cover 480.

According to various embodiments, the electronic device 400 may include an interposer 500 (e.g., a stacked board) interposed between the first substrate 420 and the second substrate 430. According to an embodiment, the interposer 500 may include a plurality of conductive terminals, and may come into physical contact with conductive terminals disposed on the two boards 420 and 430 so as to electrically connect the two boards 420 and 430. For example, the interposer 500 may be mounted on the first substrate 420 through pre-solder applied to each of the plurality of conductive terminals. In another embodiment, the interposer 500 may be mounted on the second substrate 430 via pre-solder applied to each of the plurality of conductive terminals. According to an embodiment, the interposer 500 may include a plurality of conductive terminals (e.g., the conductive terminals 524 and 525 in FIG. 5) electrically connected to a surface forming the first substrate 420 and/or the second substrate 430 and provided on at least a portion (e.g., the first surface 5101 or the second surface 5102 in FIG. 5) of a dielectric substrate (e.g., the dielectric substrate 510 in FIG. 5), a plurality of conductive pads (e.g., the conductive pads 521 and 522 in FIG. 5) provided between the conductive terminals 524 and 525, and CVs (e.g., the CV in FIG. 5) configured to electrically interconnect the plurality of conductive terminals and the plurality of conductive pads.

According to various embodiments, the electronic device 400 may include a second support member 470 (e.g., a fixing bracket) disposed between the second substrate 430 and the rear cover 480. According to an embodiment, the second support member 470 may be disposed at a position at which the second support member 470 at least partially overlaps the second substrate 430. According to an embodiment, the second support member 470 may include a metal plate. According to an embodiment, the first substrate 420, the interposer 500, and the second substrate 430 may be fixed to the first support member 411 via the second support member 470. For example, the second support member 470 may be fastened to the first support member 411 via a fastening member (e.g., a screw) to firmly support the electrical connection among the first substrate 420, the interposer 500, and the second substrate 430, which may be helpful for reinforcing rigidity. In another embodiment, the first substrate 420, the interposer 500, and the second substrate 430 may be disposed in the inner space of the electronic device 400 without the second support member 470.

Figure 5:
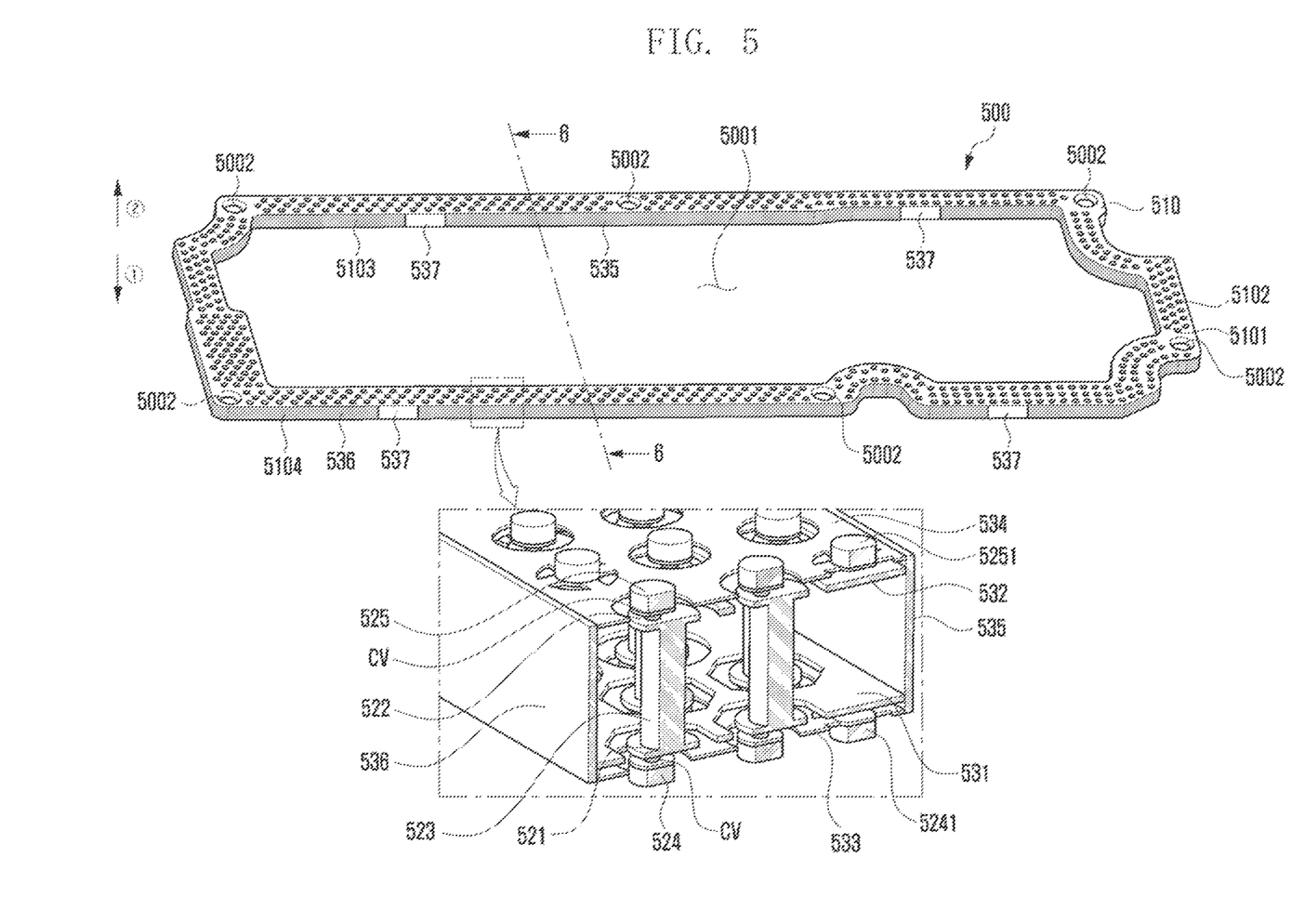
FIG. 5 is a perspective view of an interposer according to various embodiments of the disclosure.
Figure 6:
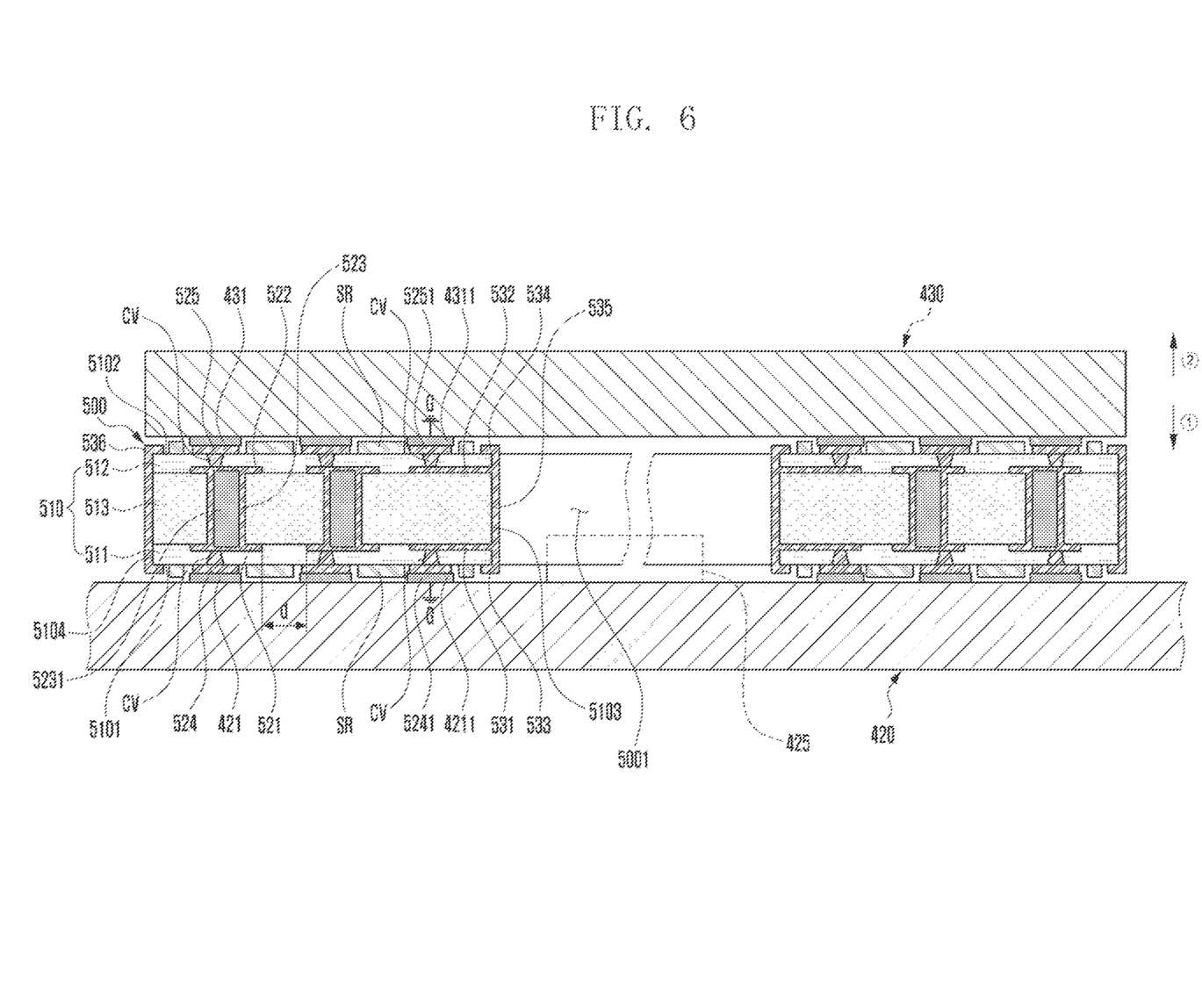
FIGS. 6 and 7 are cross-sectional views each illustrating a state in which an interposer is disposed between two boards according to various embodiments of the disclosure.
Figure 7:
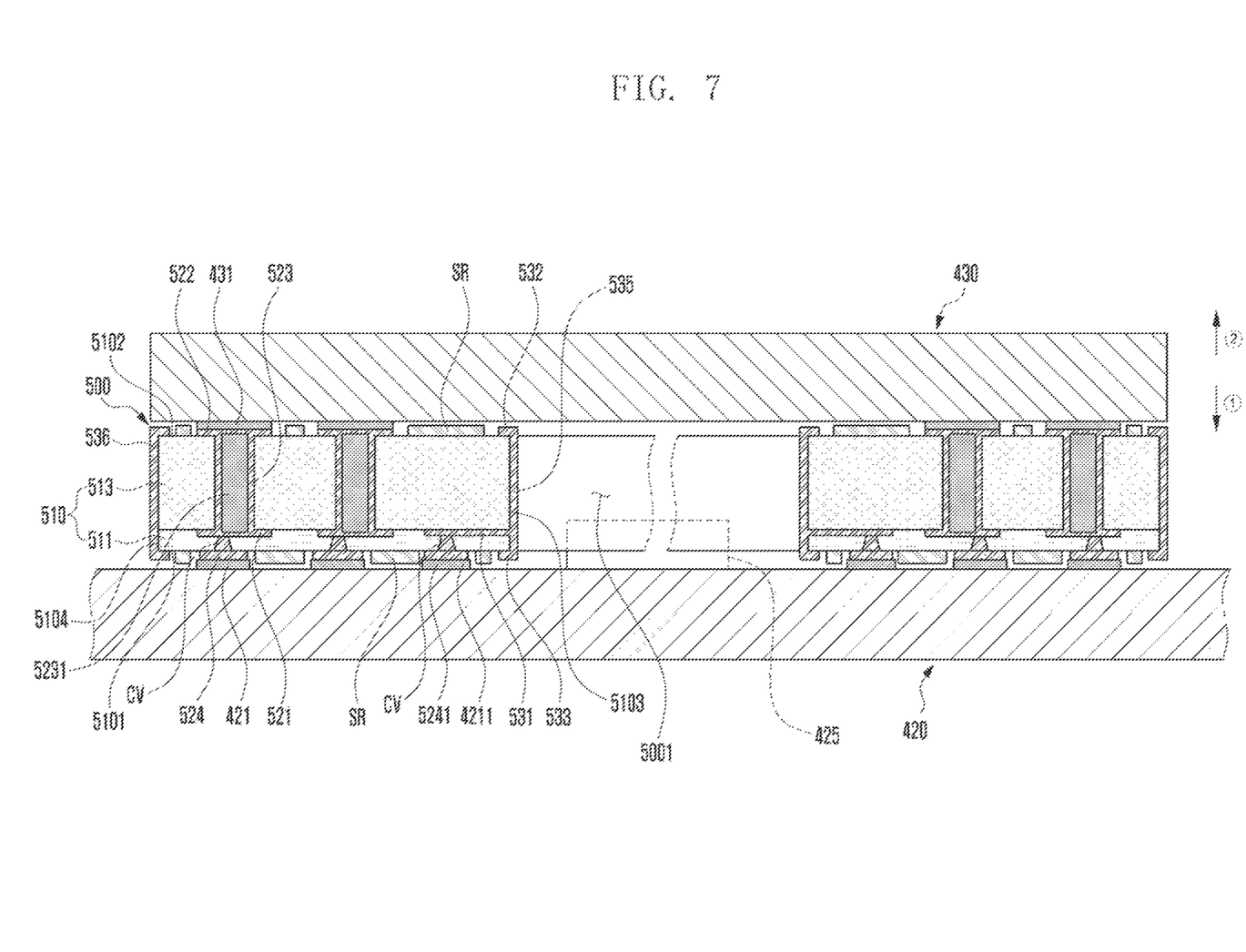

FIG. 5 is a perspective view of an interposer 500 according to various embodiments of the disclosure. FIGS. 6 and 7 are cross-sectional views each illustrating a state in which an interposer 500 is disposed between two boards 420 and 430 according to various embodiments of the disclosure.

The enlarged view of FIG. 5 illustrates only a conductive connection structure in a state in which a dielectric material (e.g., an insulating layer) is excluded from a dielectric substrate 510 of the interposer 500.

FIG. 6 is a partial cross-sectional view of the interposer 500 taken along line 6-6 of FIG. 5.

Referring to FIGS. 5 and 6, the interposer 500 may be disposed between a first substrate 420, which is disposed in an inner space of an electronic device (e.g., the electronic device 400 in FIG. 4) and includes a plurality of first conductive terminals 421, and a second substrate 420, which is disposed to be substantially parallel to the first substrate 420 and includes a plurality of second conductive terminals 431, so as to electrically interconnect the first substrate 420 and the second substrate 430. According to an embodiment, the interposer 500 may have a copper clad laminate (CCL) structure including a plurality of pre-impregnated (prepreg) material (PPG) layers (e.g., insulating resin layers) and a copper foil disposed therebetween. According to an embodiment, the interposer 500 may be configured in a loop shape including an opening 5001. According to an embodiment, the interposer 500 may include an opening 5001 in a closed loop shape. According to an embodiment, the interposer 500 may include a plurality of through-holes 5002, and may be fixed to an internal structure (e.g., a first support structure (e.g., the first support member 411 in FIG. 4) and/or a second support member (e.g., the second support member 470 in FIG. 4)) of an electronic device (e.g., the electronic device 400 in FIG. 4) together with the first substrate 420 and the second substrate 430 by fastening members (e.g., screws), which pass through the plurality of through-holes 5002.

According to various embodiments, the interposer 500 may include a dielectric substrate 510 including a first surface 5101 facing the first substrate 420 (e.g., a main board), a second surface 5102 facing away from the first surface 5101 and facing the second substrate 430 (e.g., a sub-board), and side surfaces 5103 and 5104 surrounding the space between the first surface 5101 and the second surface 5102. According to an embodiment, the dielectric substrate 510 may include a plurality of insulating layers. According to an embodiment, the interposer 500 may include a plurality of first conductive pads 521 disposed on a first insulating layer 511 close to the first surface 5101 among the plurality of insulating layers 511, 512, and 513. According to an embodiment, the plurality of first conductive pads 521 may disposed at positions that at least partially overlap respectively the plurality of first conductive terminals 421 disposed on the first substrate 420 when the first surface 5101 is viewed from above. In some embodiments, the plurality of first conductive pads 521 may be disposed at positions that do not overlap the plurality of first conductive terminals 421 when the first surface 5101 is viewed from above. According to an embodiment, the interposer 500 may include a plurality of second conductive pads 522 disposed on a second insulating layer 512 close to the second surface 5102 between the first insulating layer 511 among the plurality of insulating layers and the second surface 5102. According to an embodiment, the plurality of second conductive pads 522 may be disposed at positions that at least partially overlap respectively the plurality of second conductive terminals 431 disposed on the second substrate 430 when the second surface 5102 is viewed from above. In some embodiments, the plurality of second conductive pads 522 may be disposed at positions that do not overlap the plurality of second conductive terminals 431 when the second surface 5102 is viewed from above. According to an embodiment, the interposer 500 may include a plurality of conductive posts 523 disposed in a third insulating layer 513 between the first insulating layer 511 and the second insulating layer 512 and electrically interconnecting the plurality of first conductive pads 521 and the plurality of second conductive posts 522, respectively. According to an embodiment, the plurality of conductive posts 523 may each include metal layers applied to the inner walls of a via hole formed in the third insulating layer 513 and a dielectric material 5231 (e.g., resin) filled in the inner space therebetween. According to an embodiment, the dielectric material 5231 may be helpful for reinforcing the rigidity of the conductive posts 523.

According to various embodiments, the interposer 500 may include a plurality of third conductive terminals 524 provided to be exposed on the first surface 5101 of the dielectric substrate 510 and electrically connected to the plurality of first conductive pads 521, respectively, via CVs in a first direction (e.g., the direction C)). According to an embodiment, the plurality of third conductive terminals 524 may be electrically connected to the plurality of first conductive terminals 421 of the first substrate 420 via a bonding member such as pre-solder. According to an embodiment, the interposer 500 may include a plurality of fourth conductive terminals 525 provided to be exposed on the second surface 5102 of the dielectric substrate 510 and electrically connected to the plurality of second conductive pads 522, respectively, via CVs in a second direction (e.g., the direction C)). According to an embodiment, the plurality of fourth conductive terminals 525 may be electrically connected to the plurality of second conductive terminals 431 of the second substrate 430 via a bonding member such as pre-solder. According to one embodiment, when the first substrate 420 and the second substrate 430 are coupled to the interposer 500, the pre-solder may bind respective conductive terminals (e.g., the plurality of first conductive terminals 421, the plurality of third conductive terminals 524, the plurality of second conductive terminals 431, and the plurality of fourth conductive terminals 525) to each other through a reflow process. According to an embodiment, the reflow process is to supply solder to lands (e.g., pads) of a board and melt the solder with an external heat source for connection, and may include a soldering process for soldering on the board. In some embodiments, the soldering process is not limited to reflow soldering, and various methods other than reflow soldering, such as flow soldering, may be used. According to an embodiment, the plurality of third conductive terminals 524 may have a smaller area than the plurality of first conductive pads 521 electrically connected thereto in the inner space of the dielectric substrate 510. According to an embodiment, the plurality of fourth conductive terminals 525 may have a smaller area than the plurality of second conductive pads 522 electrically connected thereto in the inner space of the dielectric substrate 510.

According to various embodiments, a larger number of third conductive terminals 524 and a larger number of fourth conductive terminals 525, which are disposed to be exposed to the outside of the dielectric substrate 510, may be disposed in the same area compared to the arrangement configuration in which the plurality of first conductive pads 521 and the plurality of second conductive pads 522 are disposed to be exposed. This structure makes it possible to include a relatively larger number of connecting terminals (e.g., conductive terminals) in the interposer 500 having the same area, which may be helpful for slimming the electronic device. According to an embodiment, at least some of the plurality of conductive terminals 524 and 525 may be electrically connected to the ground G of the first substrate 420 and/or the second substrate 430.

According to an embodiment, the first surface 5101 and/or the second surface 5102 may be protected via a protective layer SR, except for the plurality of third conductive terminals 524 and the plurality of fourth conductive terminals 525. According to an embodiment, the protective layer SR may include a solder resist (SR) layer applied to the first surface 5101 and the second surface 5102 of the dielectric substrate.

According to various embodiments, the interposer 500 may include a first ground layer 531 disposed on the first insulating layer 511 to be insulated from the plurality of first conductive pads 521. According to an embodiment, the interposer 500 may include a second ground layer 532 disposed on the second insulating layer 512 to be insulated from the plurality of second conductive pads 522. According to an embodiment, the interposer 500 may include a third ground layer 533 disposed on the first surface 5101 to be insulated from the plurality of third conductive terminals 524 and electrically connected to the first ground layer 531. According to an embodiment, the interposer 500 may include a fourth ground layer 534 disposed on the second surface 5102 to be insulated from the plurality of fourth conductive terminals 525 and electrically connected to the second ground layer 532. According to an embodiment, the first ground layer 531 and the second ground layer 532 may be electrically connected to each other via one or more conductive portions 535 or 536 provided on the side surfaces 5103 and 5104 of the interposer 500. For example, the side surfaces 5103 and 5104 may include a first side surface 5103 (e.g., an inner side surface) facing the opening 5001 and a second side surface 5104 facing away from the first side surface 5103 (e.g., an outer side surface). According to an embodiment, the one or more conductive portions 535 and 536 may include a first conductive portion 535 at least partially applied to the first side surface 5103 and a second conductive portion 536 at least partially applied to the second side surface 5104. In some embodiments, the third ground layer 533 and/or the fourth ground layer 534 may also be electrically connected to the one or more conductive portions 535 and 536. According to an embodiment, the third ground layer 533 may have a ground structure in which at least one conductive terminal 5241 among the plurality of third conductive terminals 524 is electrically connected to at least one conductive terminal 4211, which is connected to the ground G of the first substrate 420, among the plurality of first conductive terminals 421. According to an embodiment, the fourth ground layer 534 may have a ground structure in which at least one conductive terminal 5251 among the plurality of fourth conductive terminals 525 is electrically connected to at least one conductive terminal 4311, which is connected to the ground G of the second substrate 430, among the plurality of second conductive terminals 431. According to one embodiment, the third ground layer 533 may be electrically connected to the ground G of the first substrate 420 via the first ground layer 531, a CVs, and the at least one conductive terminal 5241. According to an embodiment, the fourth ground layer 534 may be electrically connected to the ground G of the second substrate 430 via the second ground layer 532, a CV, and the at least one conductive terminal 5251. In some embodiments, the conductive terminals 5241 and 5251 of the interposer 500 for ground (e.g., the ground G) may extend from the third ground layer 533 and the fourth ground layer 534, respectively.

According to various embodiments, the first substrate 420 may include at least one electrical element 425 which is disposed in the opening 5001 of the interposer 500 when the first substrate 420 and the second substrate 430 are coupled with the interposer 500 interposed therebetween. According to an embodiment, the at least one electrical element 425 may be shielded by a first conductive portion 535 disposed on the first side surface 5103 of the dielectric substrate 510 facing the opening 5001 of the interposer 500. In some embodiments, the at least one electrical element 425 may be disposed on the second substrate 430 or on both the first substrate 420 and the second substrate 430, and may be accommodated in the opening 5001. According to an embodiment, noise generated from a signal line (e.g., an RF signal line) connected from the plurality of third conductive terminals 524 of the interposer 500 to the plurality of fourth conductive terminals 525 via conductive posts 523 may be blocked by a second conductive portion 536 disposed on the second side surface 5104 of the dielectric substrate 510.

According to various embodiments, the interposer 500 may include at least one non-conductive portion 537 disposed on at least a partial area of the first side 5103 and/or the second side 5104. According to an embodiment, the non-conductive portion 537 may include an unavoidable non-conductive area, in which an insulating layer is exposed, as a bridge area between boards or between a board and a fixing structure when the dielectric substrate 510 is manufactured. According to an embodiment, noise generated from a signal line (e.g., an RF signal line) may leak through the non-conductive portion 537. According to an embodiment, noise generated from the signal line and released to the outside through the non-conductive portion 537 may be blocked by disposing at least one conductive terminal 5241 among the plurality of third conductive terminals 524 and at least one conductive terminal 5251 among the plurality of fourth conductive terminals 525, which are electrically connected to the first ground layer 531, the second ground layer 532, the third ground layer 533, and the fourth ground layer 534, adjacent to the non-conductive portion 537. According to an embodiment, by being disposed inside the dielectric substrate without being physically connected to the first substrate 420 and/or the second substrate 430 through soldering, the plurality of first conductive pads 521 and the plurality of second conductive pads 522 may have therebetween a reduced spacing d that is capable of electrically isolating the first and second pads from each other.

In describing the interposer arrangement structure of FIG. 7, the components substantially the same as those of FIG. 6 are assigned with the same reference numerals, and a detailed description thereof may be omitted.

Referring to FIG. 7, the interposer 500 may be disposed such that the plurality of second conductive pads 522 are at least partially exposed to the second surface 5102 of the dielectric substrate 510 in the state in which the second insulating layer 512 and the plurality of fourth conductive terminals 525 are exposed from the stacked structure of FIG. 6. For example, the plurality of second conductive pads 522 may be electrically connected to the plurality of second conductive terminals 431 of the second substrate 430. For example, at least some of the plurality of second conductive pads 522 and at least some of the plurality of second conductive terminals 431 of the second substrate 430 may be electrically connected to each other through soldering. In some embodiments, the interposer 500 may be disposed such that the plurality of first conductive pads 521 are at least partially exposed to the first surface 5101 of the dielectric substrate 510 in the state in which the first insulating layer 511 and the plurality of third conductive terminals 524 are exposed from the stacked structure of FIG. 6.

According to various embodiments, the interposer 500 may be advantageous in reinforcing the rigidity capable of enduring bending or twisting (e.g., warpage (crying or smile)) through an increase of conductive layers (e.g., copper (Cu)) according to a change in the stacked structure (e.g., the change from two layers to four layers)), and may be improved in solder spreadability according to size reduction of pads (e.g., lands).

According to various embodiments, an electronic device (e.g., the electronic device 400 in FIG. 4) may include: a housing (e.g., the housing 110 in FIG. 1); a first substrate (e.g., the first substrate 420 in FIG. 6) disposed in the inner space of the housing and including a plurality of first conductive terminals (e.g., the plurality of first conductive terminals 421 in FIG. 6); a second substrate (e.g., the second substrate 430 in FIG. 6) disposed in the inner space to be substantially parallel to the first substrate and including a plurality of second conductive terminals (e.g., the plurality of second conductive terminals 431 in FIG. 6); and an interposer (e.g., the interposer 500 in FIG. 6) disposed between the first substrate and the second substrate and electrically interconnecting the first substrate and the second substrate, wherein the interposer includes: a dielectric substrate (e.g., the dielectric substrate 510 in FIG. 6) including a plurality of insulating layers, a first surface facing the first substrate (e.g., the first surface 5101 in FIG. 6), a second surface (e.g., the second surface 5102 in FIG. 6) facing the second substrate, and a side surface (e.g., the side surfaces 5103 and 5104 in FIG. 6) surrounding the space between the first surface and the second surface; a plurality of first conductive pads (e.g., the plurality of first conductive pads 521 in FIG. 6) disposed on a first insulating layer (e.g., the first insulating layer 511 in FIG. 6) close to the first surface among the plurality of insulating layers; a plurality of second conductive pads (e.g., the plurality of second conductive pads 522 in FIG. 6) disposed on a second insulating layer (e.g., the second insulating layer 512 in FIG. 6) closed to the second surface among the plurality of insulating layers; conductive posts (e.g., the conductive posts 523 in FIG. 6) electrically connecting the plurality of first conductive pads to the plurality of second conductive pads; a plurality of third conductive terminals (e.g., the plurality of third conductive terminals 524 in FIG. 6) at least partially exposed on the first surface and electrically connected to the plurality of first conductive pads via CVs (e.g., the CV in FIG. 6); and a plurality of fourth conductive terminals (e.g., the plurality of fourth conductive terminals 525 in FIG. 6) at least partially exposed on the second surface and electrically connected to the plurality of second conductive pads via CVs.

According to various embodiments, the electronic device may further include: a first ground layer (e.g., the first ground layer 531 in FIG. 6) disposed on the first insulating layer to be insulated from the plurality of first conductive pads; and a second ground layer (e.g., the second ground layer 532 in FIG. 6) disposed on the second insulating layer to be insulated from the plurality of second conductive pads.

According to various embodiments, the first ground layer and the second ground layer may be electrically connected to each other via at least one conductive portion (e.g., the one or more conductive portions 535 and 536 in FIG. 6) provided on the side surface.

According to various embodiments, the electronic device may further include: a third ground layer (e.g., the third ground layer 533 in FIG. 6) disposed on the first surface to be insulated from the plurality of third conductive terminals and electrically connected to the first ground layer via the at least one conductive portion; and a fourth ground layer (e.g., the fourth ground layer 534 in FIG. 6) disposed on the second surface to be insulated from the plurality of fourth conductive terminals and electrically connected to the second ground layer via the at least one conductive portion.

According to various embodiments, at least one conductive terminal (e.g., the conductive terminal 5241 in FIG. 6) among the plurality of third conductive terminals may be electrically connected to at least one conductive terminal (e.g., the conductive terminal 4211 in FIG. 6), which is connected to a ground of the first substrate, among the plurality of first conductive terminals, and the at least one conductive terminal among the plurality of third conductive terminals may be electrically connected to the first ground layer via a CV.

According to various embodiments, at least one conductive terminal (e.g., the conductive terminal 5251 in FIG. 6) among the plurality of fourth conductive terminals may be electrically connected to at least one conductive terminal (e.g., the conductive terminal 4311 in FIG. 6), which is connected to a ground of the second substrate, among the plurality of second conductive terminals, and the at least one conductive terminal among the plurality of fourth conductive terminals may be electrically connected to the second ground layer via a CV.

According to various embodiments, the electronic device may further include at least one non-conductive portion (e.g., the non-conductive portion 537 of FIG. 5) disposed on the side surface, wherein the at least one conductive terminal among the plurality of third conductive terminals and the at least one conductive terminal among the plurality of fourth conductive terminals may be disposed adjacent to the non-conductive portion.

According to various embodiments, the interposer may be configured in a loop shape including an opening (e.g., the opening 5001 in FIG. 6).

According to various embodiments, the side surface may include a first side surface (e.g., the first side surface 5103 in FIG. 6) facing the opening and a second side surface (e.g., the second side surface 5104 of FIG. 6) facing away from the first side surface, and the at least one conductive portion may include a first conductive portion (e.g., the first conductive portion 535 in FIG. 6) disposed on the first side surface and a second conductive portion (e.g., the second conductive portion 536 in FIG. 6) disposed on the second side surface.

According to various embodiments, the electronic device may further include at least one electrical element (e.g., the electrical element 425 in FIG. 6) disposed on the first substrate and/or the second substrate between the first substrate and the second substrate and accommodated in the opening.

According to various embodiments, each of the plurality of third conductive terminals may have a size smaller than that of each of the plurality of first conductive pads, and each of the plurality of fourth conductive terminals may have a size smaller than that of each of the plurality of second conductive pads.

According to various embodiments, an electronic device may include: a housing; a first substrate disposed in an inner space of the housing and including a plurality of first conductive terminals; a second substrate disposed in the inner space to be substantially parallel to the first substrate and including a plurality of second conductive terminals; and an interposer disposed between the first substrate and the second substrate to electrically interconnect the first substrate and the second substrate, wherein the interposer may include: a dielectric substrate including a plurality of insulating layers, and including a first surface facing the first substrate, a second surface facing the second substrate, and a side surface surrounding a space between the first surface and the second surface; a plurality of conductive pads (e.g., the plurality of conductive pads 521 in FIG. 7) disposed on a first insulating layer close to the first surface among the plurality of insulating layers; a plurality of third conductive terminals at least partially exposed on the first surface, electrically connected to the plurality of conductive pads via CVs, and electrically connected to the plurality of first conductive terminals; a plurality of fourth conductive terminals at least partially exposed on the second surface and electrically connected to the plurality of second conductive terminals; and a plurality of conductive posts configured to electrically connect the plurality of conductive pads to the plurality of third conductive terminals.

According to various embodiments, the electronic device may further include: a first ground layer disposed on the first insulating layer to be insulated from the plurality of conductive pads; a second ground layer disposed on the second surface to be insulated from the plurality of fourth conductive terminals; and a third ground layer disposed on the first surface to be insulated from the plurality of third conductive terminals.

According to various embodiments, the first ground layer, the second ground layer, and the third ground layer may be electrically connected to each other via at least one conductive portion provided on the side surface.

According to various embodiments, at least one conductive terminal among the plurality of third conductive terminals may be electrically connected to at least one conductive terminal, which is connected to a ground of the first substrate, among the plurality of first conductive terminals, and the at least one conductive terminal among the plurality of third conductive terminals may be electrically connected to the first ground layer via a CV.

According to various embodiments, at least one conductive terminal of the plurality of fourth conductive terminals may be electrically connected to at least one conductive terminal, which is connected to the ground of the second substrate, among the plurality of second conductive terminals.

According to various embodiments, the interposer may be configured in a loop shape including an opening, the side surface may include a first side surface facing the opening and a second side surface facing away from the first side surface, and the at least one conductive portion may include a first conductive portion disposed on the first side surface and a second conductive portion disposed on the second side surface.

According to various embodiments, the electronic device may further include at least one electrical element disposed on the first substrate and/or the second substrate between the first substrate and the second substrate and accommodated in the opening.

According to various embodiments, each of the plurality of third conductive terminals may have a size smaller than that of each of the plurality of conductive pads.

According to various embodiments, the interposer may include: a dielectric substrate including a plurality of insulating layers, and including a first surface facing a first substrate, a second surface facing a second substrate, and a side surface surrounding a space between the first surface and the second surface; a plurality of first conductive pads disposed on a first insulating layer close to the first surface among the plurality of insulating layers; a plurality of second conductive pads disposed on a second insulating layer close to the second surface among the plurality of insulating layers; a plurality of conductive posts configured to electrically connect the plurality of first conductive pads to the plurality of second conductive pads; a plurality of first conductive terminals (e.g., the plurality of third conductive terminals 524 in FIG. 6) at least partially exposed on the first surface and electrically connected to the plurality of first conductive pads via CVs; and a plurality of second conductive terminals (e.g., the plurality of fourth conductive terminals 525 in FIG. 6) at least partially exposed on the second surface and electrically connected to the plurality of second conductive pads via CVs.

According to various embodiments, each of the plurality of first conductive terminals may have a size smaller than that of each of the plurality of first conductive pads, and each of the plurality of second conductive terminals may have a size smaller than that of each of the plurality of second conductive pads.

The embodiments of the disclosure disclosed in this specification and drawings are provided merely to propose specific examples in order to easily describe the technical features according to the embodiments of the disclosure and to help understanding of the embodiments of the disclosure, and are not intended to limit the scope of the embodiments of the disclosure. Accordingly, the scope of the various embodiments of the disclosure should be construed in such a manner that, in addition to the embodiments disclosed herein, all changes or modifications derived from the technical idea of the various embodiments of the disclosure are included in the scope of the various embodiments of the disclosure.

What is claimed is:

1. An electronic device comprising:
a housing;
a first substrate disposed in the housing and comprising a plurality of first conductive terminals;
a second substrate disposed in the housing and comprising a plurality of second conductive terminals; and
an interposer disposed between the first substrate and the second substrate and configured to electrically connect the first substrate and the second substrate,
wherein the interposer comprises:
a dielectric substrate comprising a plurality of insulating layers, a first surface facing the first substrate, a second surface facing the second substrate, and a side surface surrounding a space between the first surface and the second surface;

a plurality of first conductive pads disposed on a first insulating layer, in the space between the first surface and the second surface, among the plurality of insulating layers;

a plurality of second conductive pads disposed on a second insulating layer, in the space between the first surface and the second surface, among the plurality of insulating layers;

a plurality of conductive posts configured to electrically connect the plurality of first conductive pads to the plurality of second conductive pads;

a plurality of third conductive terminals at least partially exposed on the first surface and electrically connected to the plurality of first conductive pads via a first conductive via (CV); and a plurality of fourth conductive terminals at least partially exposed on the second surface and electrically connected to the plurality of second conductive pads via a second CV.

2. The electronic device of claim 1, further comprising:
a first ground layer disposed on the insulating layer that is insulated from the plurality of first conductive pads; and
a second ground layer disposed on the second insulating layer that is insulated from the plurality of second conductive pads.

3. The electronic device of claim 2, wherein the first ground layer and the second ground layer are electrically connected via at least one conductive portion provided on the side surface.

4. The electronic device of claim 3, further comprising:
a third ground layer disposed on the first surface that is insulated from the plurality of third conductive terminals and electrically connected to the first ground layer via the at least one conductive portion; and
a fourth ground layer disposed on the second surface that is insulated from the plurality of fourth conductive terminals and electrically connected to the second ground layer via the at least one conductive portion.

5. The electronic device of claim 2, wherein at least one conductive terminal among the plurality of third conductive terminals is electrically connected to at least one conductive terminal, the at least one conductive terminal being connected to a ground of the first substrate, among the plurality of first conductive terminals, and
wherein the at least one conductive terminal among the plurality of third conductive terminals is electrically connected to the first ground layer via a third CV.

6. The electronic device of claim 5, wherein at least one conductive terminal among the plurality of fourth conductive terminals is electrically connected to at least one conductive terminal, which is connected to a ground of the second substrate, among the plurality of second conductive terminals, and
wherein the at least one conductive terminal among the plurality of fourth conductive terminals is electrically connected to the second ground layer via a fourth CV.

7. The electronic device of claim 6, further comprising at least one non-conductive portion disposed on the side surface,
wherein the at least one conductive terminal among the plurality of third conductive terminals and the at least one conductive terminal among the plurality of fourth conductive terminals are disposed adjacent to the non-conductive portion.

8. The electronic device of claim 3, wherein the interposer comprises an opening and is configured in a loop shape.

9. The electronic device of claim 8, wherein the side surface comprises a first side surface facing the opening and a second side surface facing away from the first side surface, and
wherein the at least one conductive portion comprises a first conductive portion disposed on the first side surface and a second conductive portion disposed on the second side surface.

10. The electronic device of claim 8, further comprising at least one electrical element disposed on the first substrate and/or the second substrate between the first substrate and the second substrate and accommodated in the opening.

11. The electronic device of claim 1, wherein each of the plurality of third conductive terminals has a size smaller than that of each of the plurality of first conductive pads, and
wherein each of the plurality of fourth conductive terminals has a size smaller than that of each of the plurality of second conductive pads.

12. An electronic device comprising:
a housing;
a first substrate disposed in the housing and comprising a plurality of first conductive terminals;
a second substrate disposed in the housing and comprising a plurality of second conductive terminals; and
an interposer disposed between the first substrate and the second substrate to electrically connect the first substrate and the second substrate,
wherein the interposer comprises:
a dielectric substrate comprising a plurality of insulating layers, a first surface facing the first substrate, a second surface facing the second substrate, and a side surface surrounding a space between the first surface and the second surface;
a plurality of conductive pads disposed on a first insulating layer in the space between the first surface and the second surface among the plurality of insulating layers;
a plurality of third conductive terminals at least partially exposed on the first surface, electrically connected to the plurality of conductive pads via a conductive via (CV), and electrically connected to the plurality of first conductive terminals;
a plurality of fourth conductive terminals at least partially exposed on the second surface and electrically connected to the plurality of second conductive terminals; and
a plurality of conductive posts configured to electrically connect the plurality of conductive pads to the plurality of third conductive terminals.

13. The electronic device of claim 12, further comprising:
a first ground layer disposed on the first insulating layer that is insulated from the plurality of conductive pads;
a second ground layer disposed on the second surface that is insulated from the plurality of fourth conductive terminals; and
a third ground layer disposed on the first surface that is insulated from the plurality of third conductive terminals.

14. The electronic device of claim 13, wherein the first ground layer, the second ground layer, and the third ground layer are electrically connected to each other via at least one conductive portion provided on the side surface.

15. The electronic device of claim 13, wherein at least one conductive terminal among the plurality of third conductive terminals is electrically connected to at least one conductive terminal, which is connected to a ground of the first substrate, among of the plurality of first conductive terminals, and wherein the at least one conductive terminal among the plurality of third conductive terminals is electrically connected to the first ground layer via a third CV.

16. An interposer comprising:
a dielectric substrate including a plurality of insulating layers, a first surface facing a first substrate, a second surface facing a second substrate, and a side surface surrounding a space between the first surface and the second surface;
a plurality of first conductive pads disposed on a first insulating layer in the space between the first surface and the second surface among the plurality of insulating layers;
a plurality of second conductive pads disposed on a second insulating layer in the space between the first surface and the second surface among the plurality of insulating layers;
a plurality of conductive posts configured to electrically connect the plurality of first conductive pads to the plurality of second conductive pads;
a plurality of first conductive terminals at least partially exposed on the first surface and electrically connected to the plurality of first conductive pads via CVs; and
a plurality of second conductive terminals at least partially exposed on the second surface and electrically connected to the plurality of second conductive pads via CVs.

17. The electronic device of claim 16, wherein each of the plurality of first conductive terminals comprises a size smaller than that of each of the plurality of first conductive pads, and
each of the plurality of second conductive terminals comprises a size smaller than that of each of the plurality of second conductive pads.

* * * * *